United States Patent [19]

Iwashimizu et al.

[11] 4,369,209
[45] Jan. 18, 1983

[54] METHOD OF MANUFACTURING A MAGNETIC BUBBLE MEMORY ELEMENT

[75] Inventors: Tadashi Iwashimizu; Yasukazu Morita, both of Mobara; Koichi Igarashi, Chosei, all of Japan

[73] Assignee: Hitachi, Ltd., Tokyo, Japan

[21] Appl. No.: 880,096

[22] Filed: Feb. 22, 1978

[30] Foreign Application Priority Data

Mar. 2, 1977 [JP] Japan .................................. 52/21518

[51] Int. Cl.³ .............................................. H01F 10/26
[52] U.S. Cl. .................................... 427/123; 427/131; 427/132; 427/264; 427/289
[58] Field of Search ............................. 427/127–130, 427/48, 123, 264, 289

[56] References Cited

U.S. PATENT DOCUMENTS 4,060,448 11/1977 Nemiroff et al. ................ 427/131 X Primary Examiner—Bernard D. Pianalto
Attorney, Agent, or Firm—Charles E. Pfund

[57] ABSTRACT

A magnetic bubble memory element comprising a magnetic bubble memory unit and a separating region portion, which is prepared by the steps of forming a plurality of island shaped magnetic bubble memory units with separating regions intervening therebetween on a single crystalline substrate and performing the cutting process along the separating regions. In a preferably prepared memory element, the magnetic bubble memory unit and the separating region portion own in common a single crystalline magnetic thin layer which is formed on the substrate and the memory unit further comprises a hard bubble suppression film deposited on the magnetic thin layer, a conductor pattern layer and a magnetic film pattern layer both of which are deposited in that order on the suppression film so as to be insulated therefrom as well as insulated from each other. In another preferably prepared memory element, the memory unit and the separating region portion own in common the single crystalline magnetic thin layer and the hard bubble suppression film, and the memory unit further comprises the conductor pattern layer and the magnetic film pattern layer both of which are deposited in that order on the suppression film so as to be insulated therefrom as well as insulated from each other.

5 Claims, 7 Drawing Figures

METHOD OF MANUFACTURING A MAGNETIC BUBBLE MEMORY ELEMENT

BACKGROUND OF THE INVENTION

This invention relates to a magnetic bubble memory element. In particular, the present invention is concerned with a magnetic bubble memory element prepared by dividing the wafer which includes a plurality of island shaped magnetic bubble memory units (called memory unit hereinafter) and a plurality of separating regions intervening between the memory units above into separated memory units (magnetic bubble memory elements) and a method of manufacturing the same.

Generally, in a memory device making use of magnetic bubble memory elements, information "1" or "0" is discriminated by the presence of magnetic bubble, and memory operation in such a device is carried out by letting the magnetic bubble line in the closed loop circuit for transporting magnetic bubbles memorize information. In the device described above, it has been often experienced that normal memory operation is disturbed by generation of hard bubbles (abnormal magnetic bubbles) in the single crystalline magnetic thin film in the magnetic bubble memory element. This abnormally generated bubble is entirely different from the bubble which is made use of as a medium for memory. As a method of suppressing generation of hard bubbles, it is well known to form a thin film of a soft ferromagnetic material such as permalloy on the single crystalline magnetic thin film by deposition or other suitable way. The present invention is especially good for the magnetic bubble memory element which is provided with the hard bubble suppression film, so that the discussion will be developed in the following paragraphs in connection with the magnetic bubble memory element of that kind.

In the prior art method of manufacturing the magnetic bubble memory element of this class, the following steps have been taken which comprise forming a single crystalline magnetic thin film on the entire surface of a single crystalline substrate, forming a hard bubble suppression film on said thin film, forming a first insulating layer uniformly on said hard bubble suppression film and then forming a conductor pattern layer, a second insulating layer, a magnetic film pattern layer and a third insulating layer in order, thereby the wafer which includes a plurality of island shaped memory units being completed. In the process of completing the wafer, there is formed along the periphery of each of memory units a margin (called a separating region hereinafter) which has no concern with the function of the magnetic bubble memory element. By cutting the wafer along separating regions, memory units are separated from one another to become magnetic bubble memory elements.

According to the method above, however, the individual magnetic bubble memory element is prepared by dividing the wafer into pellets. Division of the wafer is usually performed by the process of scribing or dicing. This process, however, can not be proceeded without giving insulating films near the cut portion a lot of fine cracks which are caused by a physical force during the cutting work. The cracks are originated from the cutting portion in the separating region and usually extend to the inside of the memory unit. Since the suppression film is extending to the cutting portion, the cracks generated in the insulating film just on the suppression film invite serious problems, for example, oxidation of the suppression film which is caused by water vapour or oxygen in the air coming into the cracks. Same problem will be raised in the magnetic pattern layer and the conductor pattern layer when the cracks are generated in insulating films lying on those layers. By these phenomena, the function and reliability of the memory element are often fatally damaged.

In order to overcome the difficulty above, it has been tried to widen the width of separating region to the extent that cracks due to cutting stress can not reach the inside of the memory unit. This countermeasure, however, could not be essential, or rather it gave such an undesirable result that density of memory unit formation on the wafer is decreased to a large extent.

SUMMARY OF THE INVENTION

According, an object of the present invention is to provide a magnetic bubble memory element and a method of manufacturing the same in which the insulating film is protected from receiving cracks while the wafer is being cut into magnetic bubble memory elements.

According to one aspect of the present invention, there is provided a magnetic bubble memory element including a magnetic bubble memory unit and a separating region portion which are formed on a single crystalline substrate, characterized in that the above memory unit comprises a single crystalline magnetic thin film which is formed on the substrate and maintains a bubble domain, a hard bubble suppression film which is formed on the thin film, a conductor pattern layer and a magnetic film pattern layer, both of which are insulated from said suppression film as well as they are isolated from each other, and that the separation region portion and the memory unit own the single crystalline magnetic thin film in common.

According to another aspect of this invention, there is provided a method of manufacturing a magnetic bubble memory element including the steps of providing on a single crystalline substrate a plurality of island shaped magnetic bubble memory units and separating regions intervening therebetween so as to form a magnetic bubble memory element wafer and dividing the wafer into individual magnetic bubble memory elements by cutting said separating regions, characterized in that the method comprises the steps of forming a single crystalline magnetic thin film over the entire surface of the single crystalline substrate, forming a film for suppressing generation of hard bubbles only in the place corresponding to the memory units on said single crystalline magnetic thin film, accumulating in order on said suppression film a first insulating layer, one of a conductor pattern layer and a magnetic film pattern layer, a second insulating layer, the other of the conductor pattern and magnetic film pattern layers and a third insulating layer, and dividing the wafer by cutting along separating region.

According to still another aspect, there is provided a method of manufacturing a magnetic bubble memory element including the steps of providing on a single crystalline substrate a plurality of island shaped magnetic bubble memory units and separating regions intervening therebetween so as to form a magnetic bubble memory element wafer and dividing the wafer into individual magnetic bubble memory elements by cutting said separating regions, characterized in that the method comprises the steps of forming a single crystalline magnetic thin film over the entire surface of the single crystalline substrate, forming a film for suppressing generation of hard bubbles over the entire surface of said crystalline magnetic thin film, forming a first insulating film only in the place corresponding to the memory units, accumulating in order on said first insulating layer, one of a conductor pattern layer and a magnetic film pattern layer, a second insulating layer, the other of the conductor pattern and magnetic film pattern layers and a third insulating layer, and dividing the wafer by cutting it along the separating regions.

According to still another aspect of the present invention, there is provided a method of manufacturing a magnetic bubble memory element including the steps of providing on a single crystalline substrate a plurality of island shaped magnetic bubble memory units and separating regions intervening therebetween so as to form a magnetic bubble memory element wafer and dividing the wafer into individual magnetic bubble memory elements by cutting said separating regions, characterized in that the method comprises the steps of forming in order over the entire surface of the single crystalline substrate a single crystalline magnetic thin film, a suppression film against generation of hard bubbles, a first insulating layer, one of a conductor pattern layer and a magnetic film pattern layer, a second insulating layer, the other of the conductor pattern and magnetic film pattern layers and a third insulating layer, removing said suppression film and all of the layers accumulated thereon at portions corresponding to separating regions, and dividing the wafer by cutting it along said separating regions.

According to still another aspect, there is provided a method of manufacturing a magnetic bubble memory element including the steps of providing on a single crystalline substrate a plurality of island shaped magnetic bubble memory units and separating regions intervening therebetween so as to form a magnetic bubble memory element wafer and dividing the wafer into individual magnetic bubble memory elements by cutting said separating regions, characterized in that the method comprises the steps of accumulating in order over the entire surface of a single crystalline substrate a single crystalline magnetic thin film, a film for suppressing generation of a hard bubble, a first insulating layer, one of a conductor pattern layer and a magnetic film pattern layer, a second insulating layer, the other of the conductor pattern and magnetic film pattern layers and a third insulating layer, removing the first insulating layer and all the layers accumulated thereon, and dividing the wafer by cutting said separating regions.

BRIEF DESCRIPTION OF THE DRAWINGS

In the accompanying drawings.

DETAILED DESCRIPTION OF PREFERRED EMBODIMENTS

Figure 1A:
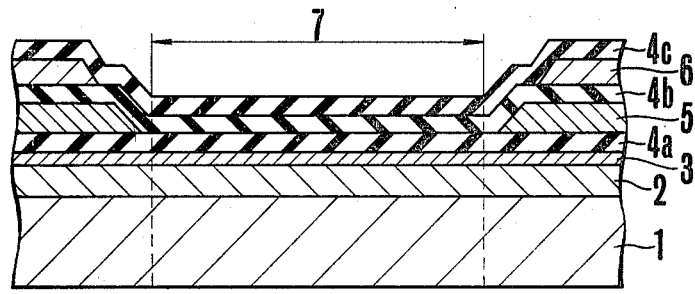
FIG. 1A is a sectional diagrammatical representation for showing the substantial part of the prior art magnetic bubble memory element wafer.
Figure 1B:
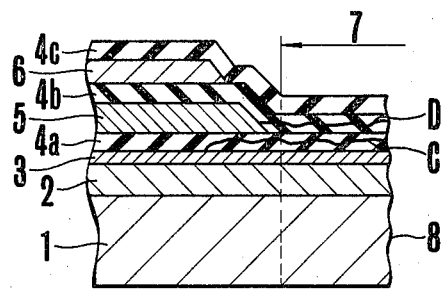
FIG. 1B is a sectional diagrammatical representation for showing the substantial part of the memory element obtained by cutting the wafer shown in FIG. 1 at separating regions.

Since it will be helpful for understanding the present invention to review the prior art magnetic bubble memory element having a film for suppressing generation of hard bubbles as shown in FIGS. 1A and 1B, the brief discussion will be made in a few following paragraphs before entering into description of the present invention. In FIG. 1A, a reference numeral 1 designates a single crystalline substrate which is made of garnet including gadolinium and gallium (so-called G.G.G. substrate). On the substrate 1 above there is epitaxially formed a single crystalline magnetic thin film 2 which is capable of generating bubble domains and keeping the same therein. On the magnetic thin film 2 above, a hard bubble suppression film 3 is further formed. The formation of the hard bubble suppression film 3 may be performed by means of vapor deposition of a soft ferromagnetic material such as permalloy, implantation of hydrogen ion or formation of a $Y_3Fe_5O_{12}$ film by chemical vapor deposition, for example. Further, a first insulating layer 4a made of silicon dioxide (SiO2) or the like is uniformly formed on said hard bubble suppression film 3. Then, a conductor pattern layer 5 for use in control circuit of magnetic bubbles, a second insulating layer 4b, a magnetic film pattern layer 6 (called permalloy layer hereafter) for use in a closed loop magnetic bubble transporting circuit, and a third insulating layer 4c are accumulated in order on said first insulating film, thereby a plurality of magnetic bubble memory units being formed on the substrate to complete a sheet of magnetic bubble memory element wafer. Then, this wafer follows the scribing or dicing process to receive cuttings at separating regions 7 which are formed around the peripheries of magnetic bubble memory units having no concern with the function of memory units. Through this process, the wafer is divided into individual magnetic bubble memory elements.

In short, a plurality of island shaped magnetic bubble memory units are formed on the single crystalline substrate having separating regions 7 intervening therebetween so as to form the magnetic bubble memory element wafer, and then individual memory elements are separated from one another by cutting said separating regions 7. Thus, the individual memory element eventually has the structure as shown in FIG. 1B, which comprises a memory unit 10a and a separating region portion 10b.

The structure above, however, has such a serious defect that, due to cutting stress, cracks like ones shown by symbols C and D are generated in SiO2 insulating layer extending from the cut face 8 to the inside of SiO2 layer, and that the suppression film 3 and the conductor pattern layer 5 are oxidized by oxidation agents in the air brought through said cracks.

Figure 2A:
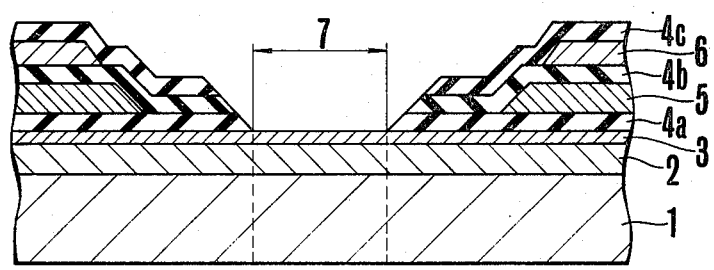
FIG. 2A is a sectional diagrammatical representation for showing the substantial part of a magnetic bubble memory element wafer according to the invention.
Figure 2B:
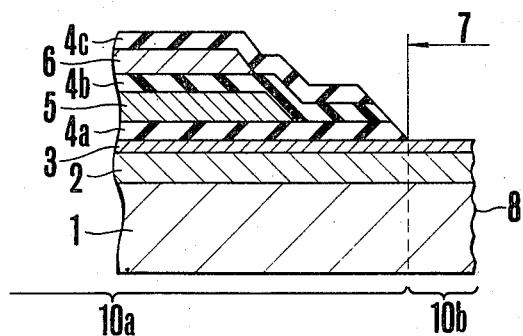
FIG. 2B is a sectional diagrammatical representation for showing the substantial part of the memory element obtained by cutting the wafer of FIG. 2A at separating regions.

Now referring to FIGS. 2A and 2B which are cross-sectional diagrammatical representations for showing the substantial part of the magnetic bubble memory element according to the present invention and in which same parts as shown in FIGS. 1A and 1B bear like reference numerals, it will be seen that the structure shown by FIG. 2A is different from the one in FIG. 1A at the point that insulating films 4a, 4b and 4c accumulated in the place corresponding to the separating region 7 are removed from the surface of the hard bubble suppression film 3. This removal may be made at once by using photoetching technique. Photoetching itself is well known but application in this invention will be simply explained. After insulating layers 4a, 4b and 4c are formed over the entire surface of the substrate 1, the photoresist, which becomes insoluble against water after light exposure, is applied to the top insulating layer 4c so as to entirely cover it. Then, light exposure is carried out by using a mask having a pattern which is transparent at the portion corresponding to the memory unit while not transparent at the portion corresponding to the separating region. By this exposure, the photoresist applied becomes insoluble against water only at the portion having received light exposure, i.e., at the memory unit portion. Accordingly, the photoresist on the separating region may be readily removed by water rinsing. Then, an etchant for etching $SiO_2$ is applied to the revealed insulating layer portion over the separating region, thereby the structure as shown in FIG. 2A being obtained where insulating layers are completely removed from the separating region while they are firmly remaining on the memory unit. Instead of the above steps, it is possible to use the above photoresist technique at every stage of forming respective insulating layers so as to remove them from the separating region at every step. Obviously, in the case of using the photoresist which becomes soluble in water after light exposure, the negative-positive pattern of the mask is reversed. The magnetic bubble memory element wafer as constructed above then follows the cutting process such as scribing or dicing to be divided into individual memory elements which have the structure as shown in FIG. 2B. According to this structure, thanks to removal of insulating layers 4a, 4b and 4c existing only on separating regions, the insulating layers 4a, 4b and 4c in the magnetic bubble memory unit become entirely free from cracks produced by the stress during the cutting process, thus the conductor pattern layer 5 and the permalloy pattern layer 6 being prevented from being oxidized or undesirably affected.

In the embodiment as described above, the separating region portion 10b of the memory element includes the single crystal magnetic thin layer 2 and the film 3 for suppressing generation of hard bubbles which are owned in common by the magnetic bubble memory unit 10a. Accordingly, instead of removing the layers after accumulation thereof, it is possible to accumulate only on the portion corresponding to the memory unit the first insulating layer 4a, the conductor pattern 5, the second insulating layer 4b, the permalloy layer 6 and the third layer 4c in that order by applying a masking to the separating regions.

Figure 3A:
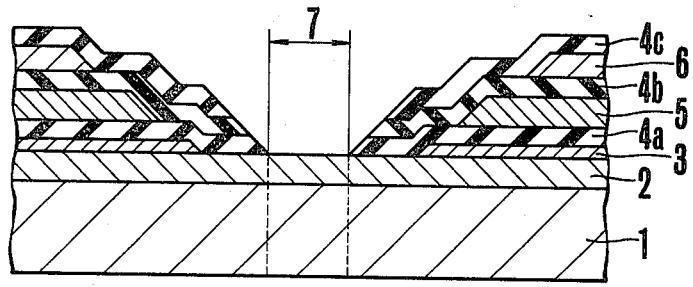
FIG. 3A is a sectional diagrammatical representation for showing another example of the wafer according to this invention.
Figure 3B:
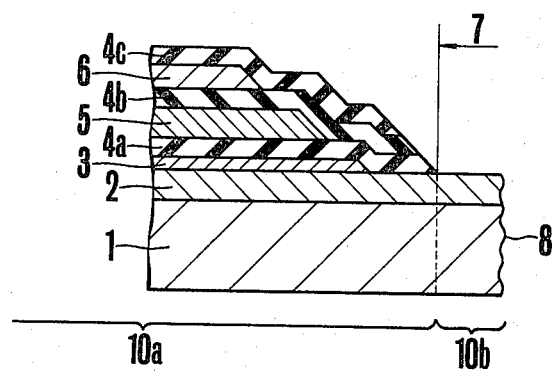
FIG. 3B is a sectional diagrammatical representation for showing a substantial part of the memory device obtained by cutting the wafer of FIG. 3A at separating regions.

Another embodiment of this invention is shown in FIGS. 3A and 3B. In the figures, like parts shown in FIGS. 1A, 1B, 2A and 2B are bearing like reference numerals. Difference between the structures shown in FIG. 3A and FIG. 2A is that the hard bubble suppression film 3 disappears from the surface of the single crystal magnetic thin film 2 at the portion corresponding to the separating region. Selective deposition of the hard bubble suppression film 3 may be readily realized, for example, by applying a mask pattern covering only separating regions to the surface of the single crystal magnetic thin film 2 during deposition process, or by photoetching. Then, there are accumulated on the hard bubble suppression film 3 except on the separating regions 7 the first insulating layer 4a, the conductor pattern layer 5, the second insulating layer 4b, the permalloy pattern layer 6, the third insulating layer 4c in that order so as to form the wafer shown in FIG. 3A.

In the magnetic bubble memory element wafer constructed as above, the insulating layers 4a, 4b and 4c in the memory unit are entirely free from cracks due to the stress during the cutting of separating regions because the insulating layers 4a, 4b and 4c are removed away from the portion receiving scribing or dicing. Further, since the hard bubble suppression film 3 is entirely covered by the insulating layer 4a, it is completely isolated from the atmosphere, thereby undesirable factors such as moisture, oxidizing agents in the air being prevented to increase reliability of memory elements.

Further, if powders produced in cutting the separating regions are scattered to deposit on the memory element, memory function is not affected thereby because there is no permalloy layer on the separating regions so that powders never include permalloy. For the same reason, if the separating region includes no magnetic thin layer 2 therein, the function of the memory element will be more hardly affected by cutting work.

Figure 4:
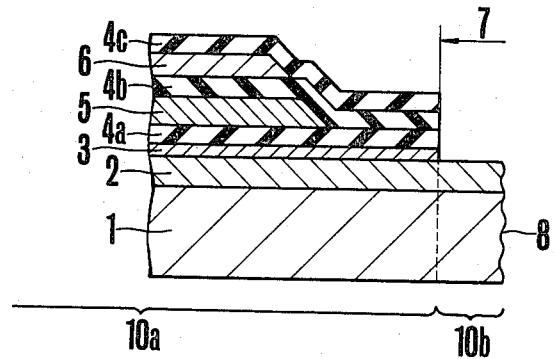
FIG. 4 is a sectional diagrammatical representation for showing a substantial part of another example of the memory element according to the invention.

The separating region portion 10b of this example includes the single crystal magnetic thin layer 2 owned in common by the portion of memory unit 10a. Accordingly, it is possible to form the hard bubble suppression film 3 over the entire surface of the magnetic thin layer 2, to accumulate thereon necessary insulating and pattern layers and then to remove the suppression film 3 and others deposited thereon at once in the separating regions by utilizing a known method such as photoetching or ion-etching. By this process, however, the periphery of the suppression film 3 cannot but be exposed to the air as in FIG. 4.

Although in the foregoing embodiments the permalloy layer 6 was formed above the conductor pattern layer 5, it should be understood that this relation of accumulation may be reversed, if desired.

As discussed above, according to the present invention, in the magnetic bubble memory element of the class wherein the element comprises the single crystal substrate, the single crystal magnetic thin layer maintaining magnetic domain, the hard bubble suppression film, insulating layers, the conductor pattern layer and the magnetic pattern layer which are deposited one after another, there are provided separating regions from which said suppression region and insulating layers are removed, thereby cracks generated in insulating layers due to cutting stress being surely prevented. Accordingly, oxidation of the suppression film, conductor pattern layer and magnetic film pattern layer is completely prevented, and further, the edge of the hard bubble suppression film is entirely covered by the insulating layer so that oxidation and corrosion of the suppression film are prevented, thereby excellent performance of the memory element being realized with high reliability.

What is claimed is:

1. In a method of manufacturing a magnetic bubble memory element including the steps of providing on a single crystalline substrate a plurality of island shaped magnetic bubble memory units and separating regions intervening therebetween so as to form a magnetic bubble memory element wafer and dividing the wafer into individual magnetic bubble memory elements by cutting said separating regions, the improvement wherein the method comprises the steps of forming a single crystalline magnetic thin film over the entire surface of the single crystalline substrate, forming a film for suppressing generation of hard bubbles only in the place corresponding to the memory units on said single crystalline magnetic thin film, accumulating in order on said suppression film a first insulating layer, a conductor pattern layer, a second insulating layer, a magnetic film pattern layer and a third insulating layer, and dividing the wafer by cutting it along said separating regions.

2. In a method of manufacturing a magnetic bubble memory element including the steps of providing on a single crystalline substrate a plurality of island shaped magnetic bubble memory units and separating regions intervening therebetween so as to form a magnetic bubble memory element wafer and dividing the wafer into individual magnetic bubble memory elements by cutting said separating regions, the improvement wherein the method comprises the steps of forming a single crystalline magnetic thin film over the entire surface of the single crystalline substrate, depositing a film for suppressing generation of hard bubbles over the entire surface of said crystalline magnetic thin film, depositing a first insulating film only in the place corresponding to the memory units, accumulating in order on said first insulating layer, a conductor pattern layer, a second insulating layer, a magnetic film pattern layer and a third insulating layer, and dividing the wafer by cutting it along said separating regions.

3. In a method of manufacturing a magnetic bubble memory element including the steps of providing on a single crystalline substrate a plurality of island shaped magnetic bubble memory units and separating regions intervening therebetween so as to form a magnetic bubble memory element wafer and dividing the wafer into individual magnetic bubble memory elements by cutting said separating regions, the improvement wherein the method comprises the steps of forming in order over the entire surface of the single crystalline substrate a single crystalline magnetic thin film, a suppression film against generation of hard bubbles, a first insulating layer, a conductor pattern layer, a second insulating layer, a magnetic film pattern layer and a third insulating layer, removing said suppression film and all of the layers accumulated thereon at portions corresponding to separating regions, and dividing the wafer by cutting it along said separating regions.

4. The method of claim 1 wherein the step of accumulating a first insulating layer on said suppressing film includes the step of applying the first insulating layer such that it covers both the surface of the suppressing film opposite said crystalline magnetic thin film and also the edges of said suppressing film so that after said subsequent step of dividing, said suppressing film is completely isolated from the surrounding environment by said crystalline magnetic thin film and said first insulating layer.

5. In a method of manufacturing a magnetic bubble memory element including the steps of providing on a single crystalline substrate a plurality of island shaped magnetic bubble memory units and separating regions intervening therebetween so as to form a magnetic bubble memory element wafer and dividing the wafer into individual magnetic bubble memory elements by cutting said separating regions, the improvement wherein the method comprises the steps of accumulating in order over the entire surface of a single crystalline substrate a single crystalline magnetic thin film, a film for suppressing generation of a hard bubble, a first insulating layer, a conductor pattern layer, a second insulating layer, a magnetic film pattern layer and a third insulating layer, removing the first insulating layer and all the layers accumulated thereon at portions corresponding to said separating regions, and dividing the wafer by cutting it along said separating regions.

* * * * *